United States Patent
Sagisaka et al.

(10) Patent No.: US 7,818,709 B2
(45) Date of Patent: Oct. 19, 2010

(54) CIRCUIT-PATTERN-DATA CORRECTION METHOD AND SEMICONDUCTOR-DEVICE MANUFACTURING METHOD

(75) Inventors: Atsushi Sagisaka, Kawasaki (JP); Tatsuo Chijimatsu, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 91 days.

(21) Appl. No.: 11/515,203

(22) Filed: Sep. 5, 2006

(65) Prior Publication Data

US 2007/0220477 A1  Sep. 20, 2007

(30) Foreign Application Priority Data

Mar. 20, 2006  (JP) ............... 2006-076642

(51) Int. Cl.
*G06F 17/50* (2006.01)
*G03F 1/00* (2006.01)
*G03F 7/20* (2006.01)

(52) U.S. Cl. .............. 716/21; 716/19; 716/20; 430/5; 430/296

(58) Field of Classification Search ............ 716/19–21; 430/5, 296
See application file for complete search history.

(56) References Cited

U.S. PATENT DOCUMENTS

| | | | |
|---|---|---|---|
| 6,749,972 B2 * | 6/2004 | Yu | 430/5 |
| 7,000,208 B2 * | 2/2006 | Zhang | 716/11 |
| 7,024,655 B2 * | 4/2006 | Cobb | 716/19 |
| 7,065,739 B2 * | 6/2006 | Kobayashi et al. | 716/21 |
| 7,132,203 B2 * | 11/2006 | Pierrat | 430/5 |
| 7,263,683 B1 * | 8/2007 | Capodieci | 716/21 |
| 7,418,693 B1 * | 8/2008 | Gennari et al. | 716/19 |
| 7,487,490 B2 * | 2/2009 | Zhang et al. | 716/21 |
| 2005/0106473 A1 * | 5/2005 | Huang | 430/5 |
| 2006/0083995 A1 * | 4/2006 | Kanai | 430/5 |
| 2007/0083846 A1 * | 4/2007 | Chuang et al. | 716/19 |
| 2008/0050676 A1 * | 2/2008 | Hoshino | 430/296 |

FOREIGN PATENT DOCUMENTS

| | | |
|---|---|---|
| JP | 2002-072441 A | 3/2002 |
| JP | 2002-083757 A | 3/2002 |

OTHER PUBLICATIONS

Shi et al "The selection and creation of the rules in rules-based optical proximity correction"; Oct. 23-25, 2001; ASIC, 2001Proceedings. 4th International Conference on; pp. 50-53.*

\* cited by examiner

*Primary Examiner*—Helen Rossoshek
(74) *Attorney, Agent, or Firm*—Fujitsu Patent Center

(57) ABSTRACT

Circuit-pattern-data correction method and semiconductor-device manufacturing method which prevent excessive correction from being made when model-based proximity-effect correction (OPC) is applied to a corrected circuit pattern, the excessive correction being caused by a step (difference in level) close to a circuit-pattern corner in the corrected circuit pattern, and the step being produced when rule-base OPC is applied. The rule-based OPC is applied to input design data in step S1; a step close to a circuit-pattern corner, produced by the rule-based OPC is detected in step S2; the step is removed in step S3; and the model-based OPC is applied and exposure data is generated in step S4.

10 Claims, 18 Drawing Sheets

CIRCUIT-PATTERN-DATA CORRECTION METHOD AND SEMICONDUCTOR-DEVICE MANUFACTURING METHOD

CROSS-REFERENCE TO RELATED APPLICATIONS

This application is based upon and claims the benefits of priority from the prior Japanese Patent Application No. 2006-076642, filed on Mar. 20, 2006, the entire contents of which are incorporated herein by reference.

BACKGROUND OF THE INVENTION

1. Field of the Invention

The present invention relates to circuit-pattern-data correction methods and semiconductor-device manufacturing methods, and particularly to a circuit-pattern-data correction method and a semiconductor-device manufacturing method which reduce the influence of a proximity effect, produced when a circuit pattern is formed on a wafer according to design data for a semiconductor device.

2. Description of the Related Art

As semiconductor devices have been using finer patterns due to higher integration these days, the influence of a proximity effect appears greatly in an exposure process, disabling semiconductor devices to be manufactured according to the design data. To prevent this from occurring, proximity effect correction (optical proximity correction, hereinafter called OPC) for correcting a circuit pattern in design data has been generally employed in recent years so that the influence of the proximity effect is understood beforehand to obtain dimensions as designed.

OPC includes rule-based OPC and model-based OPC. The rule-based OPC performs corrections based on a correction table which specifies the amount of correction according to the width of each circuit pattern and the distance to an adjacent circuit pattern in design data. On the other hand, the model-based OPC performs corrections with the use of optical-intensity simulation, and is suited to correct complicated-shape circuit patterns for which corrections are difficult with the rule-based OPC. It is said that the model-based OPC is almost required for fine machining in the generation of 65 nm or less.

FIGS. 17A and 17B are outline views used for explaining the model-based OPC.

It is assumed here that correction is made according to the model-based OPC with a circuit pattern 500a shown in FIG. 17A being used as a target figure. In the model-based OPC, a figure is divided into sides having certain lengths at division points 501 by using the vertexes of the figure. Then, an evaluation point 502 is specified on each side, and the evaluation point 502 is moved for correction with the use of simulation to have appropriate values, such as the width and space, after exposure. For example, a corrected circuit pattern 500b shown in FIG. 17B is generated to obtain an optical-intensity simulation image 503 which matches the target figure (circuit pattern 500a) indicated by a dotted line, at the evaluation points 502. This optical-intensity simulation image 503 indicates the actual shape of a photomask such as a reticle or a resist circuit pattern to be formed on a wafer.

Since the model-based OPC is based on optical-intensity simulation, it is difficult to correct factors, such as the influence of etching, caused by processes other than lithography.

Therefore, a method is used in which the original design data is corrected first with the use of the rule-based OPC and then the model-based OPC is applied to the corrected design data.

Techniques employing the rule-based OPC to reduce the amount of data and to prevent minute protrusions, digging, and steps (differences in level) from occurring in a circuit pattern during correction are disclosed, for example, in Japanese Unexamined Patent Application Publication Nos. 2002-072441 and 2002-083757.

If a step produced when the rule-based OPC is applied is located in a vicinity of a circuit pattern corner, overcorrection is made by the model-based OPC, which is the next step, to cause a broken line and other problems.

FIGS. 18A and 18B are outline views used for explaining a model-based OPC employed when minute steps are located in vicinities of circuit pattern corners.

It is assumed here that correction is made according to the model-based OPC with a circuit pattern 510a, shown in FIG. 18A, obtained when the rule-based OPC is applied, being used as a target figure. As described earlier, in the model-based OPC, division points 511 are specified by using the vertexes of the figure. Therefore, when a step is located in a vicinity of a circuit pattern corner, a division point 511 is specified in a vicinity of the circuit pattern corner. Then, an evaluation point 512 is also specified close to the circuit pattern corner.

At circuit pattern corners, as indicated by an optical-intensity simulation image 513 shown in FIG. 18B, a resist cannot be patterned in the same way as the target figure, and is rounded. Therefore, when an evaluation point 512 is located close to a circuit pattern corner, excessive correction is made as indicated by a corrected circuit pattern 510b so that the optical-intensity simulation image 513 is made close to the target figure at the evaluation point 512. Using such a corrected circuit pattern 510b causes a narrow part or a broken line not intended.

SUMMARY OF THE INVENTION

In view of the foregoing, it is an object of the present invention to provide a circuit-pattern-data correction method capable of preventing excessive correction made by the model-based OPC and caused by a step (difference in level) located close to a circuit pattern corner, the step being generated when the rule-based OPC is applied.

Another object of the present invention is to provide a semiconductor-device manufacturing method capable of preventing excessive correction made by the model-based OPC and caused by a step located close to a circuit pattern corner, the step being generated when the rule-based OPC is applied.

To accomplish one of the above objects, according to the present invention, there is provided a circuit-pattern-data correction method for correcting the influence of a proximity effect, produced when a circuit pattern is formed on a wafer according to semiconductor-device design data. This circuit-pattern-data correction method includes the steps of applying rule-based proximity-effect correction to the design data input; detecting a step close to a circuit-pattern corner, generated by the rule-based proximity-effect correction; and removing the step and then applying model-based proximity-effect correction, and generating exposure data.

To accomplish one of the above objects, according to the present invention, there is provided a semiconductor-device manufacturing method. This semiconductor-device manufacturing method includes the steps of, to correct the influence of a proximity effect, produced when a circuit pattern is formed on a wafer according to semiconductor-device design data, applying rule-based proximity-effect correction to the design data input; detecting a step close to a circuit-pattern corner, generated by the rule-based proximity-effect correction; removing the step and then applying model-based proximity-effect correction, and generating exposure data; generating a photomask according to the exposure data; and performing exposure by using the photomask.

The above and other objects, features and advantages of the present invention will become apparent from the following description when taken in conjunction with the accompanying drawings which illustrate preferred embodiments of the present invention by way of example.

DESCRIPTION OF THE PREFERRED EMBODIMENTS

Figure 1:
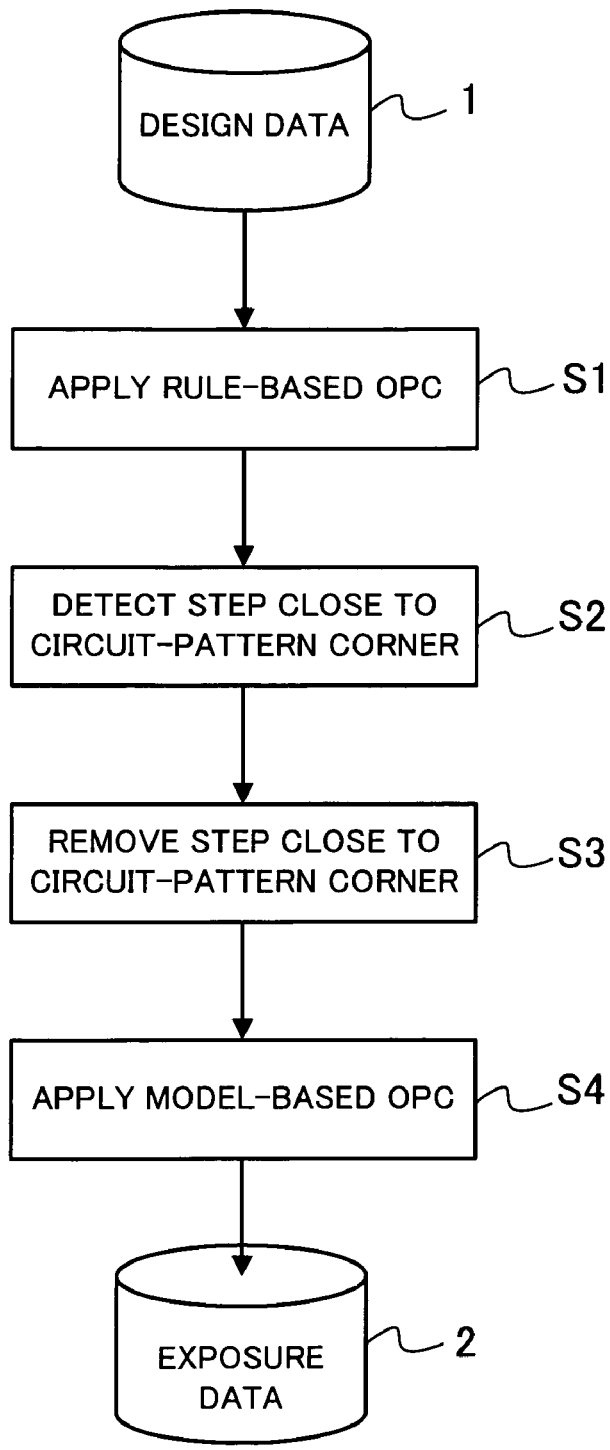
FIG. 1 is a flowchart showing an outline of a circuit-pattern-data correction method according to an embodiment of the present invention.

Embodiments of the present invention will be described below by referring to the drawings.

FIG. 1 is a flowchart showing an outline of a circuit-pattern-data correction method according to an embodiment of the present invention.

In the circuit-pattern-data correction method according to the present embodiment, proximity-effect correction based on rule-based OPC is applied in step S1 to design data 1 of a photomask such as a reticle or of a circuit pattern formed on a wafer.

Figure 18A:
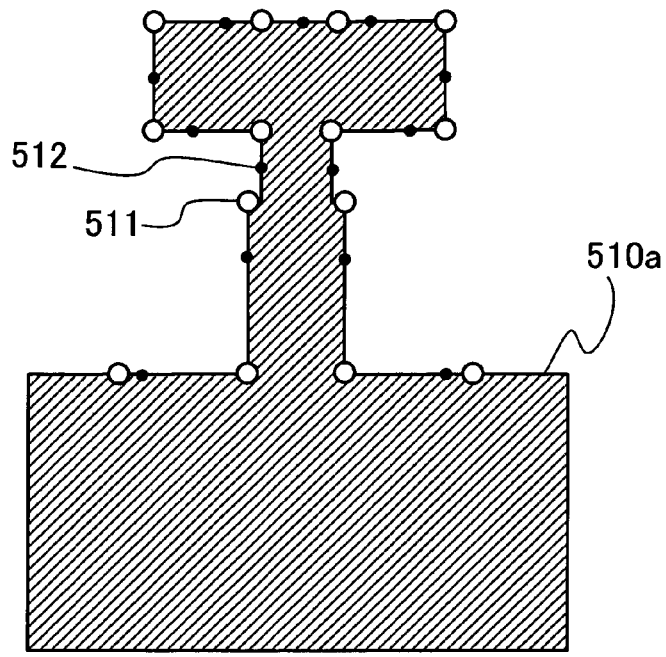
FIGS. 18A and 18B are outline views used for explaining model-based OPC employed when minute steps are located close to circuit-pattern corners.
Figure 18B:
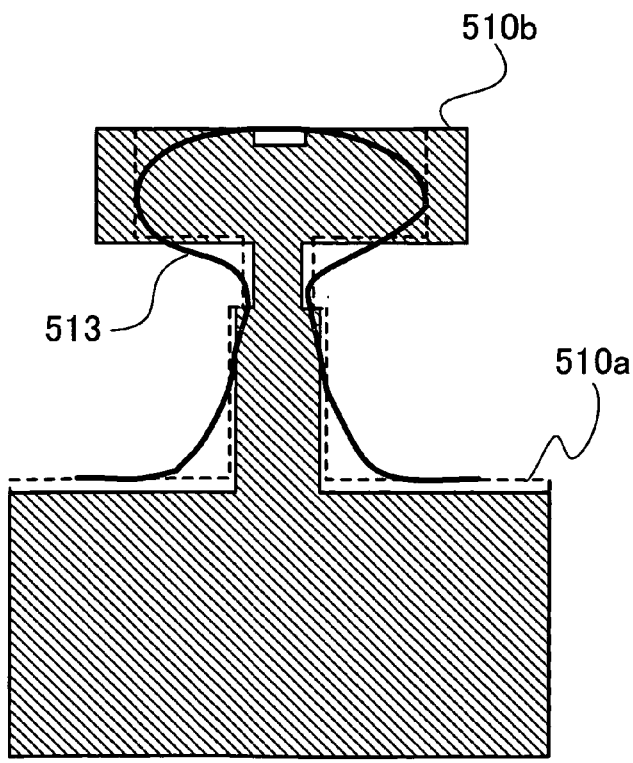

The rule-based OPC corrects the input design data 1 by using a correction table. The correction table specifies the amount of correction according to the width of a circuit pattern and the distance to an adjacent circuit pattern. For example, when the distance from a target circuit pattern to an adjacent circuit pattern is a predetermined distance or more, the width of the target circuit pattern is made thicker, or when an adjacent circuit pattern is located close, the width of the target circuit pattern is made thinner. With this, a step (difference in level) (see FIG. 18A) caused by the correction is generated in the circuit pattern to which the rule-based OPC has been applied. When this step is located close to a circuit pattern corner, an evaluation point used in model-based OPC is disposed close to the circuit pattern corner, causing excessive correction, as shown in FIG. 18B.

Therefore, in the circuit-pattern-data correction method according to the present embodiment, a step generated by the rule-based OPC in a vicinity of a circuit pattern corner is detected in step S2, and the step is removed in step S3.

Figure 2A:
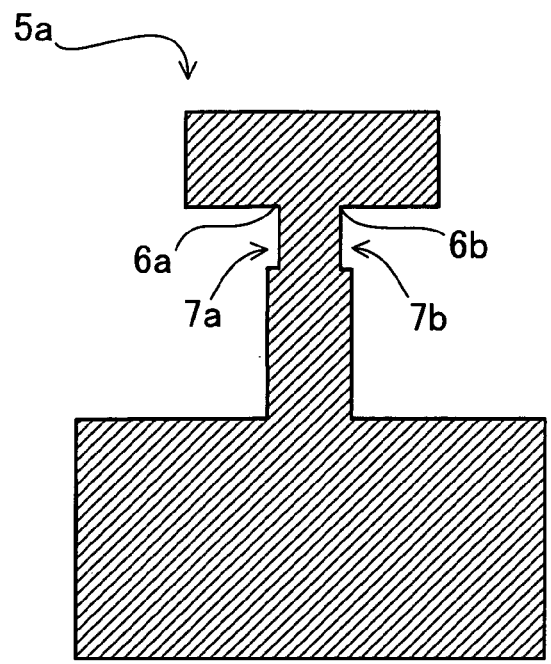
FIGS. 2A and 2B show how steps close to circuit-pattern-data corners, produced by rule-based OPC are removed.
Figure 2B:
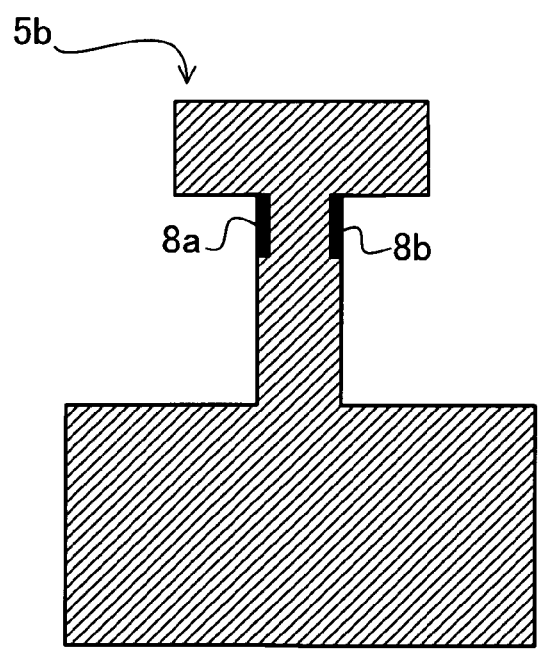

FIGS. 2A and 2B are views showing how steps generated by the rule-based OPC in vicinities of circuit pattern corners are removed.

Figure 8A:
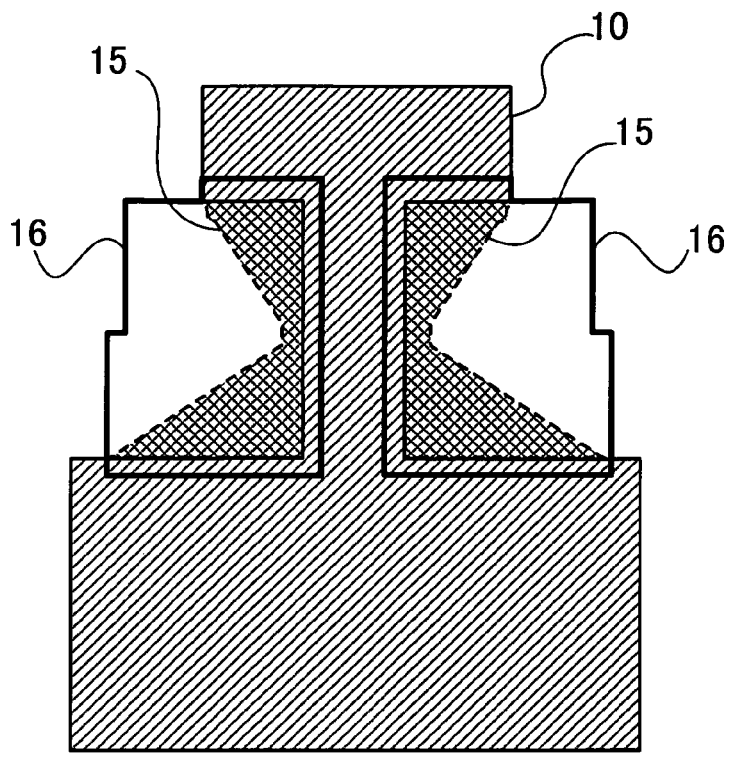
FIGS. 8A and 8B are views used for explaining the process for detecting and removing depressed steps close to circuit-pattern corners.
Figure 8B:
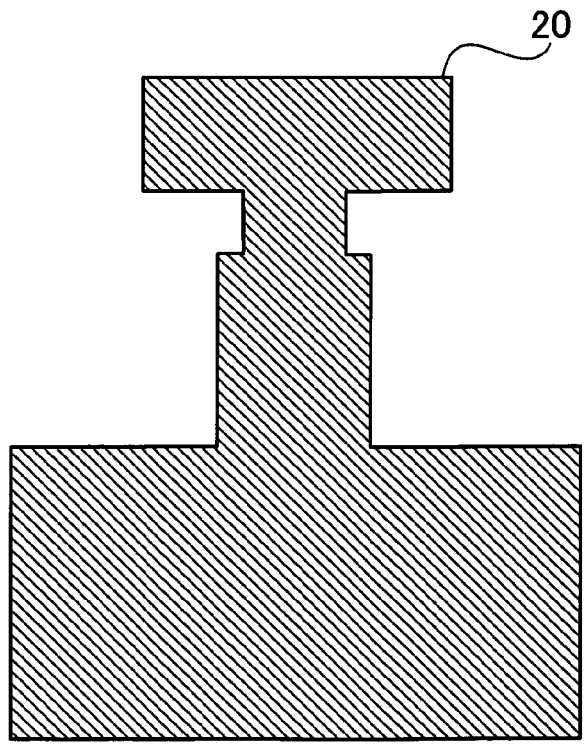

It is assumed that a corrected circuit pattern 5a shown in FIG. 2A is obtained by the rule-based OPC. The corrected circuit pattern 5a includes steps 7a and 7b having depression shapes in vicinities of corners 6a and 6b. In the process of step S3, FIGS. 8a and 8b are generated to fill in the depressed steps 7a and 7b to produce a corrected circuit pattern 5b, where the steps 7a and 7b have been removed, as shown in FIG. 2B. A method for producing such FIGS. 8a and 8b and a detailed step detection method will be described later.

Then, the model-based OPC is applied to the corrected circuit pattern 5b, where the steps 7a and 7b located closed to the corners 6a and 6b have been removed as shown in FIG. 2B, to generate exposure data 2 in step S4.

As described above, in the circuit-pattern-data correction method according to the present embodiment, steps located close to circuit-pattern corners are removed, which cause excessive correction in the model-based OPC, and then the model-based OPC is applied to generate the exposure data 2. Since evaluation points at which corrections are made in the model-based OPC are prevented from being disposed close to circuit-pattern corners, excessive correction is prevented at the circuit-pattern corners. The exposure data 2, obtained with such correction, is used to generate a photomask and exposure is performed with the use of this photomask. Narrowing or disconnection is prevented from occurring in a reticle or in a resist circuit pattern transferred to a wafer, and metal wiring is prevented from being broken.

Details of the present embodiment will be described next.

Figure 3:
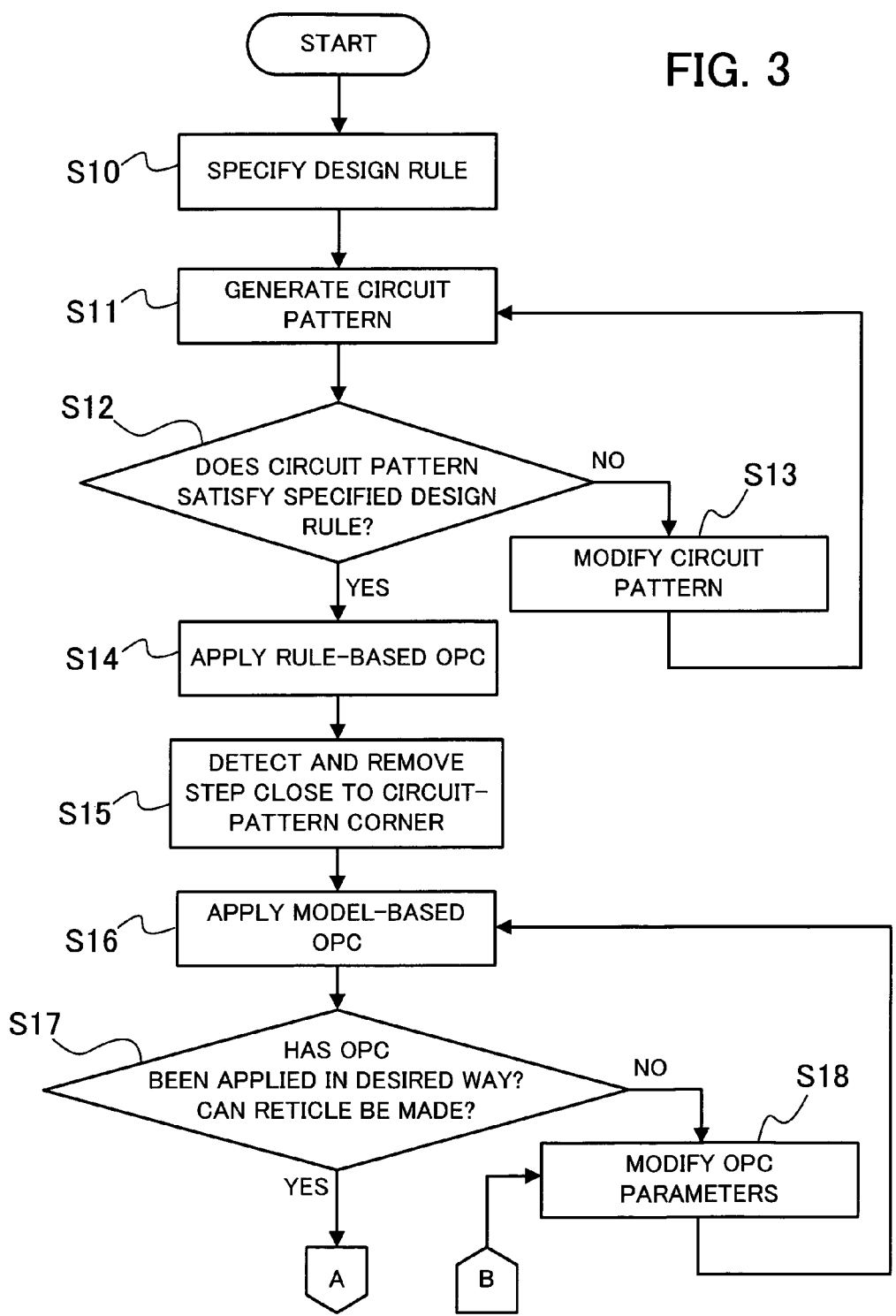
FIG. 3 is a flowchart showing a first half of a part of a semiconductor-device manufacturing process.
Figure 4:
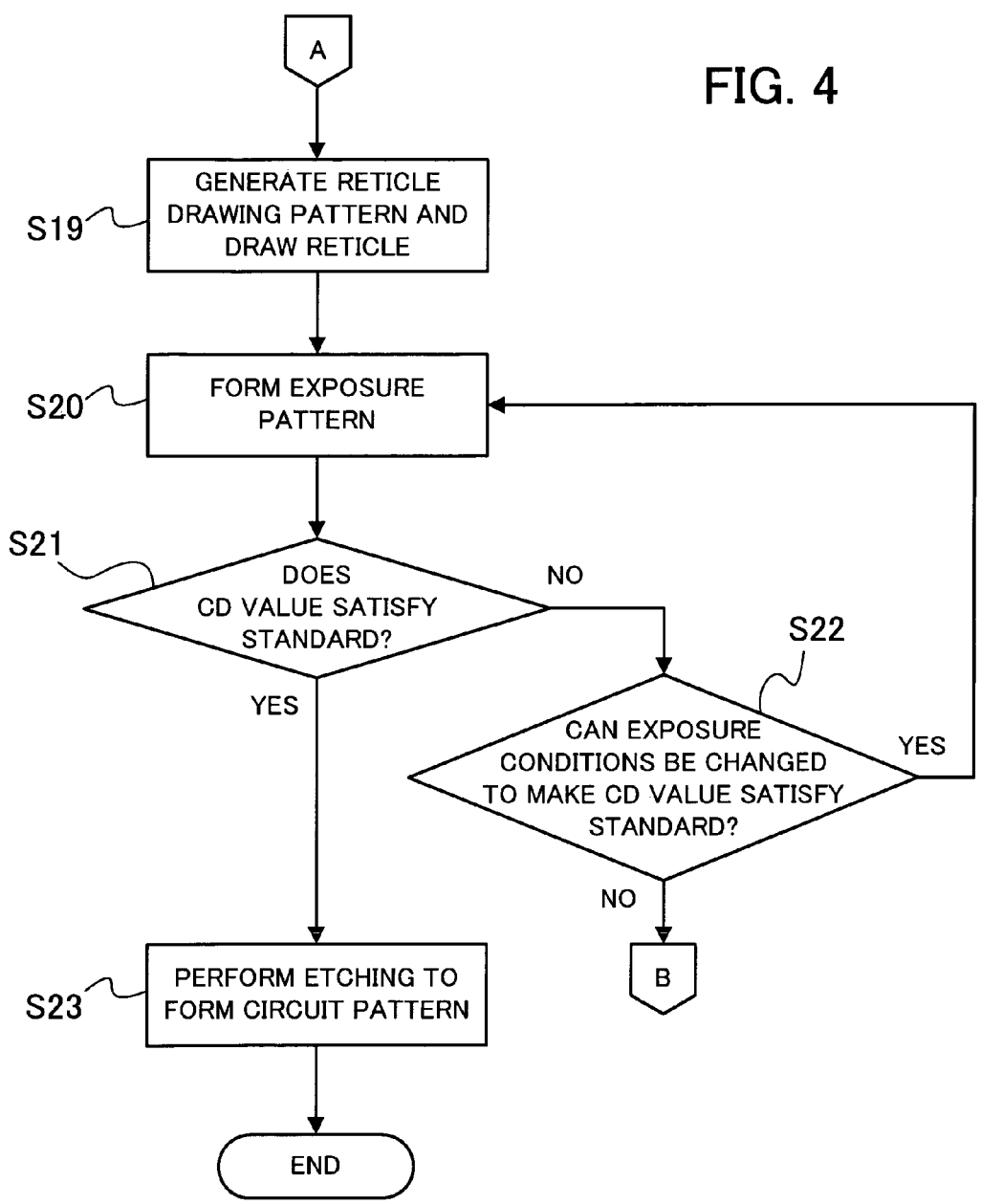
FIG. 4 is a flowchart showing a second half of the part of a semiconductor-device manufacturing process.

FIGS. 3 and 4 are a flowchart showing a part of a semiconductor-device manufacturing process.

A design rule is first specified in step S10, and a circuit pattern is generated in step S11. Then, it is determined in step S12 whether the circuit pattern satisfies the specified design rule. If not, the circuit pattern is modified in step S13, and the procedure returns to step S11 to regenerate a circuit pattern.

When the circuit pattern satisfies the specified design rule, proximity effect correction is made by the rule-based OPC in step S14. Elements (etching influence and others) that cannot be corrected by the model-based OPC are corrected. In the rule-base OPC, correction is made by using a correction table. The correction table specifies the amount of correction according to the width of a circuit pattern and the distance to an adjacent circuit pattern. For example, when the distance from a target circuit pattern to an adjacent circuit pattern is a predetermined distance or more, the width of the target circuit pattern is made thicker, or when an adjacent circuit pattern is located close, the width of the target circuit pattern is made thinner. It is assumed here that the maximum correction amount is X1 (for example, 15 nm).

When the rule-based OPC is finished, a step close to a circuit-pattern corner is detected and removed in step S15.

The model-based OPC is applied in step S16 to a corrected circuit pattern obtained by the process of step S15. After the model-based OPC is applied, the corrected circuit pattern is checked in step S17 to see whether the OPC has been applied in the desired way and whether a reticle can be made. If the OPC has not been applied in the desired way or a reticle cannot be made, OPC parameters, such as the minimum length of a side to be corrected by the model-based OPC, are modified in step S18. Then, the model-based OPC is again applied in step S16. The procedure may be returned to the process of step S15 after step S18.

The above-described processes of steps S10 to S18 are performed, for example, by a computer. A central processing unit (CPU) of the computer performs the above-described processes according to the algorithm of software stored in a storage unit such as a hard disk drive (HDD) while temporarily writing data being operated, in a random access memory (RAM). These processes may be performed, for example, by a plurality of computers connected to a network.

When it is determined by the checking in step S17 that the OPC has been applied in the desired way and a reticle can be made, exposure data (reticle drawing pattern) is generated based on the corrected circuit pattern obtained by the model-based OPC, and a photomask is made according to the exposure data. With the use of the photomask, a reticle is made by an exposure machine in step S19. Then, the reticle is used to form an exposure pattern (resist circuit pattern), with the use of a resist, on a wafer in step S20. Next, it is determined whether a critical dimension (CD) value of the formed resist circuit pattern satisfies the standard. If the CD value does not satisfy the standard, it is determined in step S22 whether the exposure conditions can be changed to make the CD value satisfy the standard. When possible, exposure parameters are adjusted in the process of step S22, and then, an exposure pattern is made on another wafer. If impossible, the procedure goes back to step S18, the OPC parameters are modified, and then, the model-based OPC is again applied.

When it is determined in step S21 that the critical dimension (CD) value of the exposure pattern formed on the wafer satisfies the standard, etching is performed with the resist circuit pattern being used as a mask to form a circuit pattern on the wafer in step S23. Although not shown in the figure, it is determined whether the CD value of the etching circuit pattern also satisfies the standard. If the CD value does not satisfy the standard, since the reason thereof comes from the OPC parameters, the model-based OPC is again applied, a reticle is made, a resist circuit pattern is formed on a wafer, and a circuit pattern is formed by etching.

The process of step S15, which is a main feature of the semiconductor-device manufacturing method according to the present embodiment, will be described next in detail.

FIGS. 5A and 5B to 11A and 11B are views used for explaining the process of detecting and removing depressed steps close to circuit-pattern corners.

It is assumed below that the design rule for metal layers of semiconductor devices in the 65-nm generation is applied, and an exposure wavelength of 193 nm and a numerical aperture of 0.85 are used.

Figure 5A:
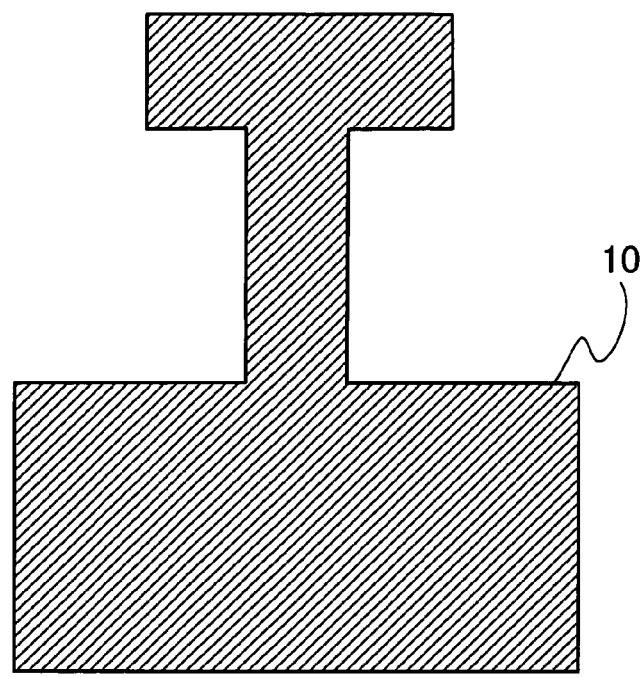
FIGS. 5A and 5B are views used for explaining a process for detecting and removing depressed steps close to circuit-pattern corners.
Figure 5B:
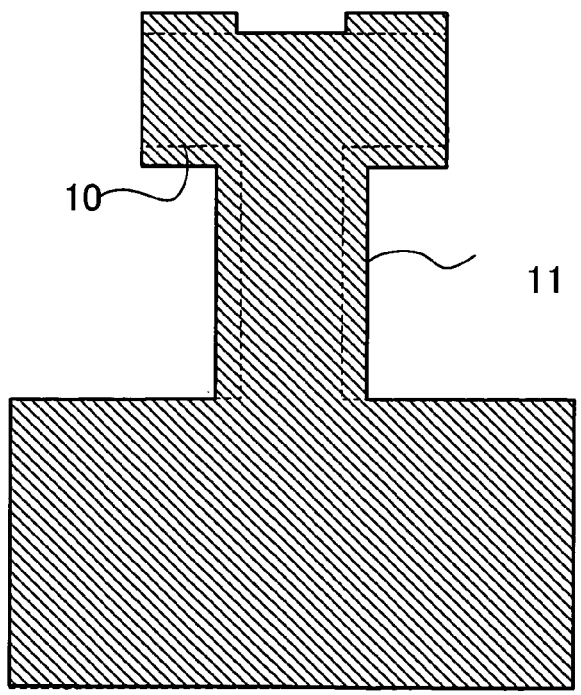
Figure 6A:
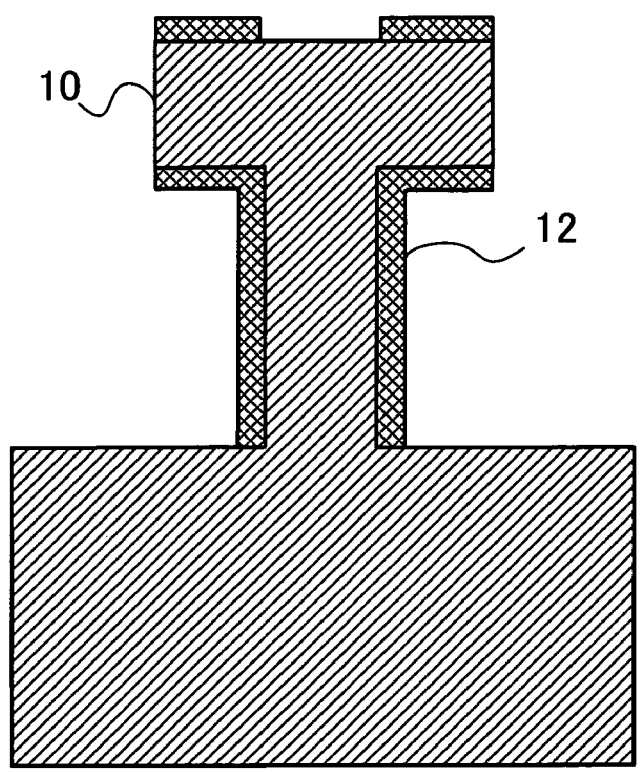
FIGS. 6A and 6B are views used for explaining the process for detecting and removing depressed steps close to circuit-pattern corners.
Figure 6B:
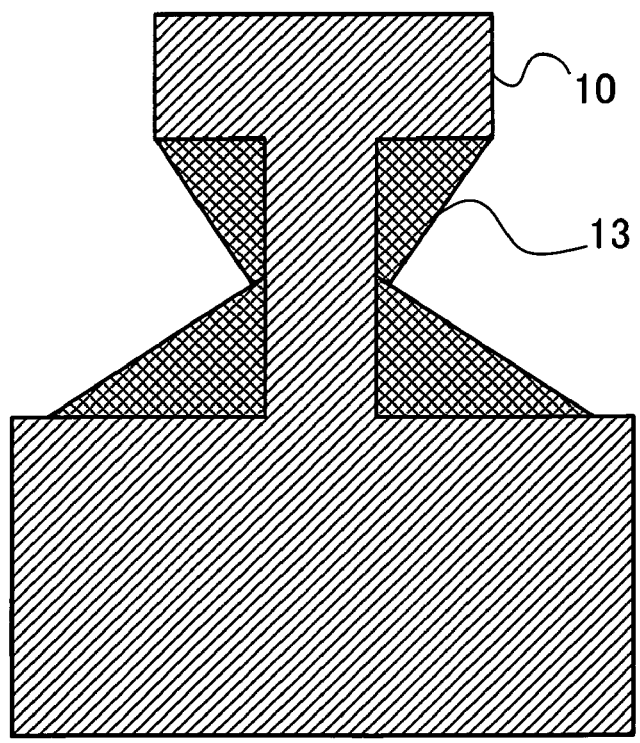

When a circuit pattern 10 shown in FIG. 5A in design data is input from a data base, for example, the CPU performs the following processing. First, the CPU makes thicker an area which may be broken when excessive correction is made by the model-based OPC, in the circuit pattern 10 to obtain a corrected circuit pattern 11 shown in FIG. 5B. More specifically, for example, an area having a line width of 1 to 2 μm or less is made thicker according to a table of the rule-based OPC. The upper limit of the width of an area made thicker is set to the maximum correction amount X1 (for example, 15 nm) used in the rule-based OPC applied in step S14 of FIG. 3.

Figure 12:
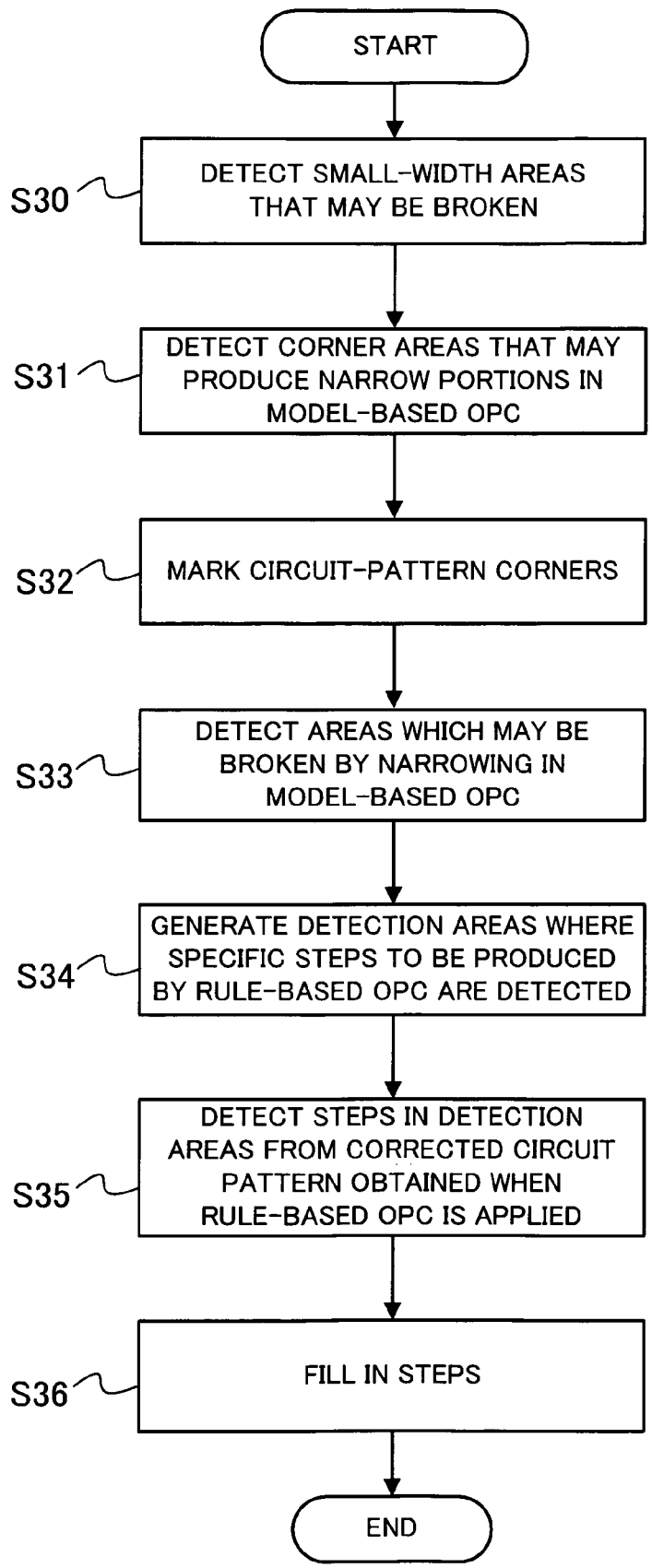
FIG. 12 is a flowchart showing the process for detecting and removing depressed steps close to circuit-pattern corners.

Next, differences between the circuit pattern 10 and the corrected circuit pattern 11 are obtained to find FIG. 12 (see FIG. 6A) indicating small-width areas which may be broken when excessive correction is made by the model-based OPC. The found FIG. 12 are temporarily stored in a memory. Then, the circuit pattern 10 in the design data is again used to form FIG. 13 (see FIG. 6B) at areas where the distances between points on two sides orthogonal to each other in the circuit pattern 10 are less than X3 and the two sides each are longer than X2, where X2 indicates the minimum length of a side to be corrected in the model-based OPC and is set, for example, to 34 nm, and X3 indicates the minimum length of a step that does not produce a narrow portion in the model-based OPC, and is set, for example, to 201 nm (this value is obtained from optical-intensity simulation and an experiment in which actual exposure is performed to form a resist circuit pattern).

The FIG. 13 correspond to corner areas where narrow portions are generated at circuit pattern corners by the model-based OPC. The generated FIG. 13 are temporarily stored in the memory.

Then, the circuit pattern 10 in the design data is again used to form FIG. 14 (see FIG. 7A) at areas where the distances between points on two sides (longer than X2) orthogonal to each other in the circuit pattern 10 are less than X4, where X4 is a length smaller than X2 by some nanometers, and is set, for example, to 30 nm. The FIG. 14 obtained here are used to mark circuit pattern corners. The generated FIG. 14 are temporarily stored in the memory.

Figure 7A:
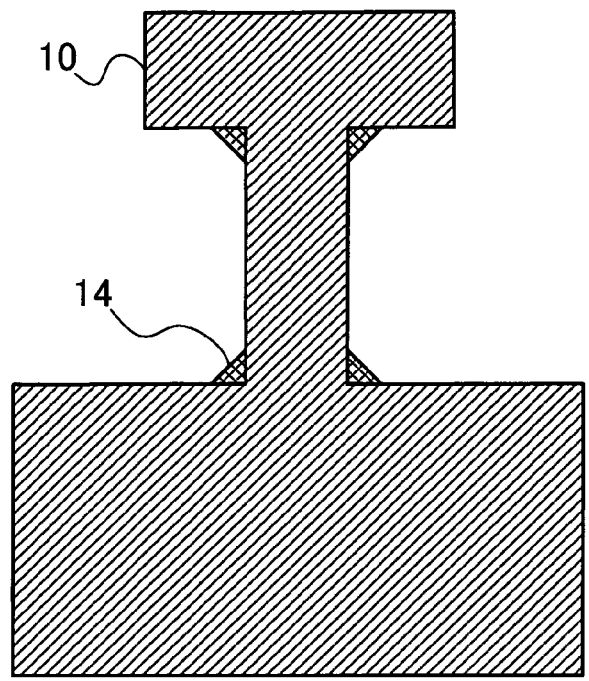
FIGS. 7A and 7B are views used for explaining the process for detecting and removing depressed steps close to circuit-pattern corners.
Figure 7B:
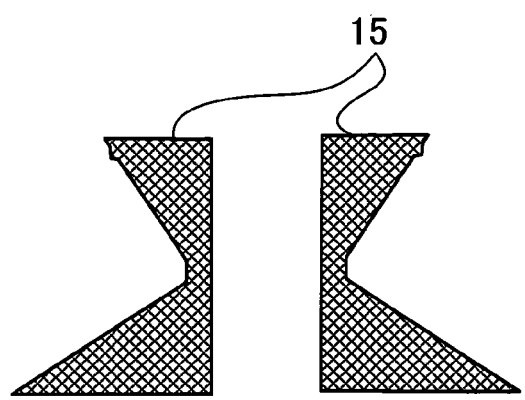

Next, the FIGS. 12 and 13 are read from the memory to put one on top of the other to generate FIG. 15 (see FIG. 7B). The FIG. 15 shows areas where narrow portions may be produced at circuit-pattern corners and broken lines may be produced, in the model-based OPC.

Figure 15A:
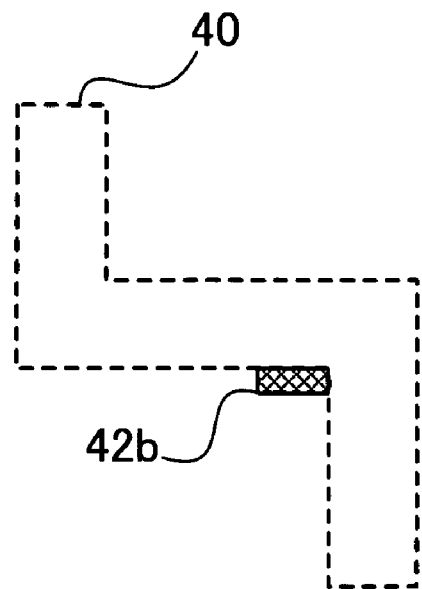
FIGS. 15A and 15B are views used for explaining the process for detecting and removing protrudent steps close to circuit-pattern corners.
Figure 15B:
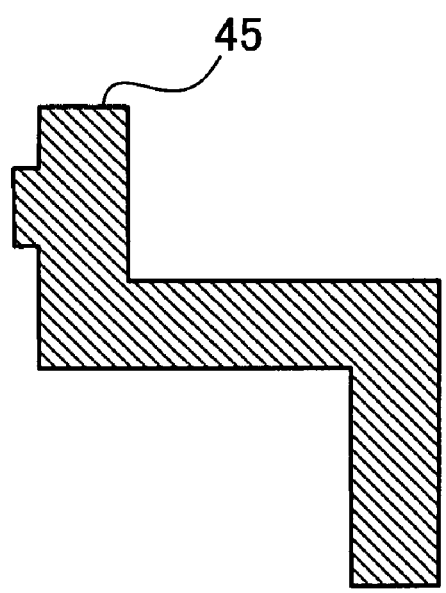
Figure 16:
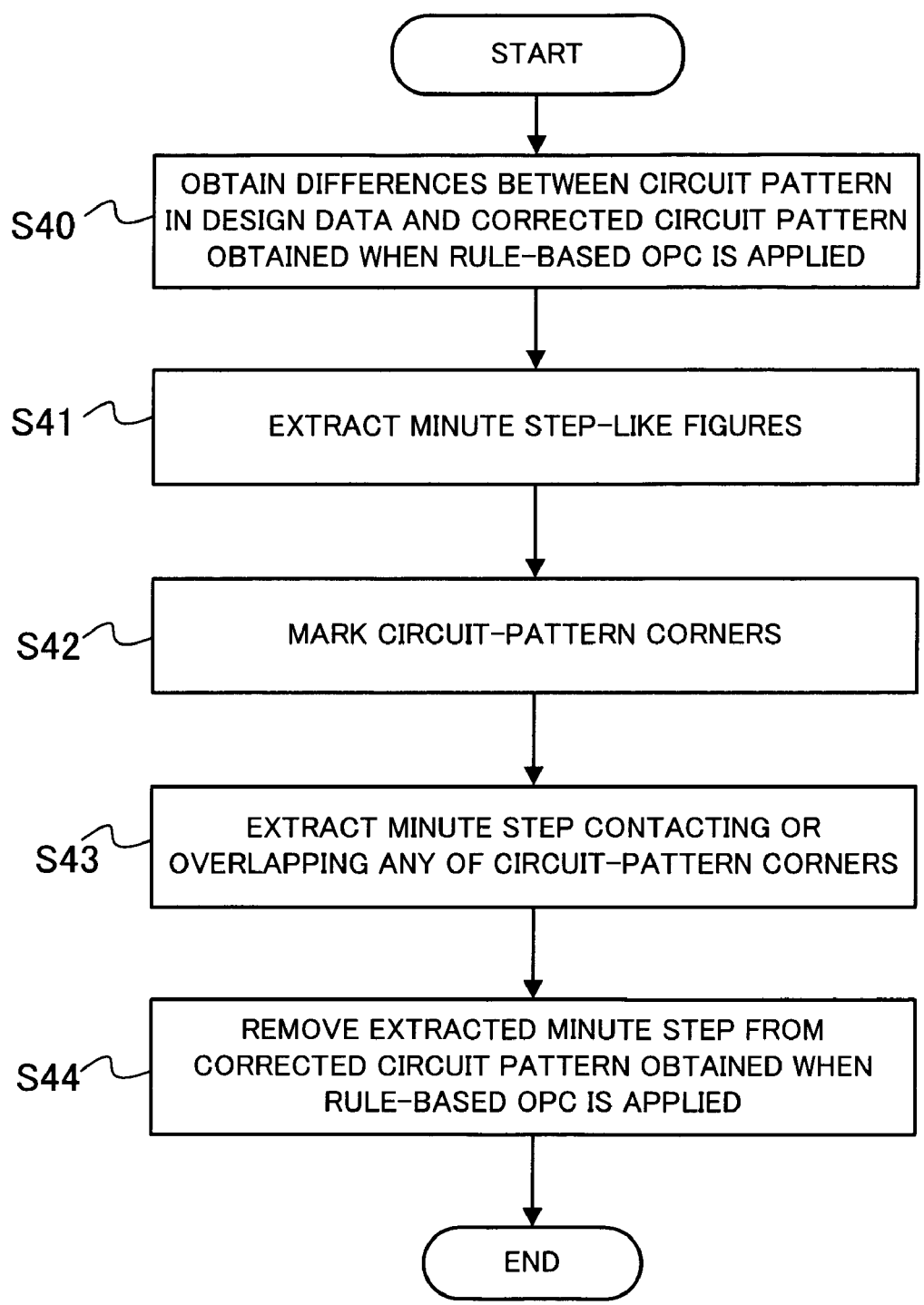
FIG. 16 is a flowchart showing the process for detecting and removing protrudent steps close to circuit-pattern corners.
Figure 17A:
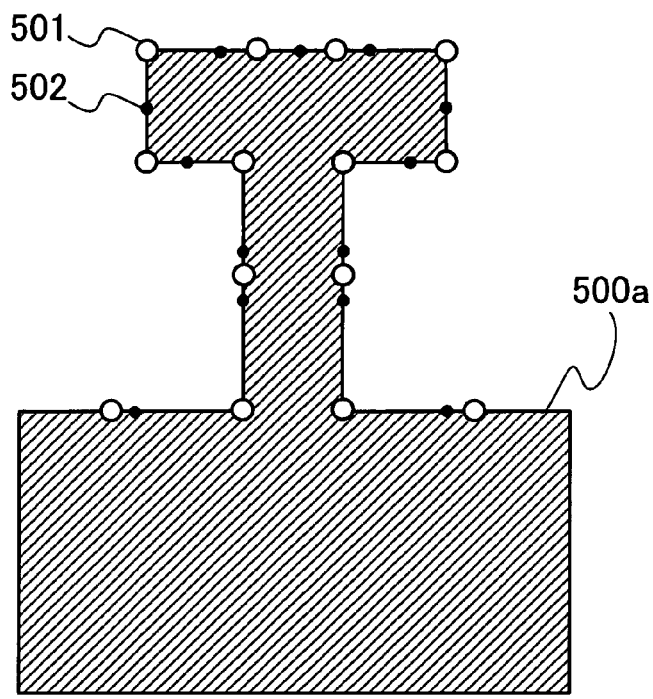
FIGS. 17A and 17B are outline views used for explaining model-based OPC.
Figure 17B:
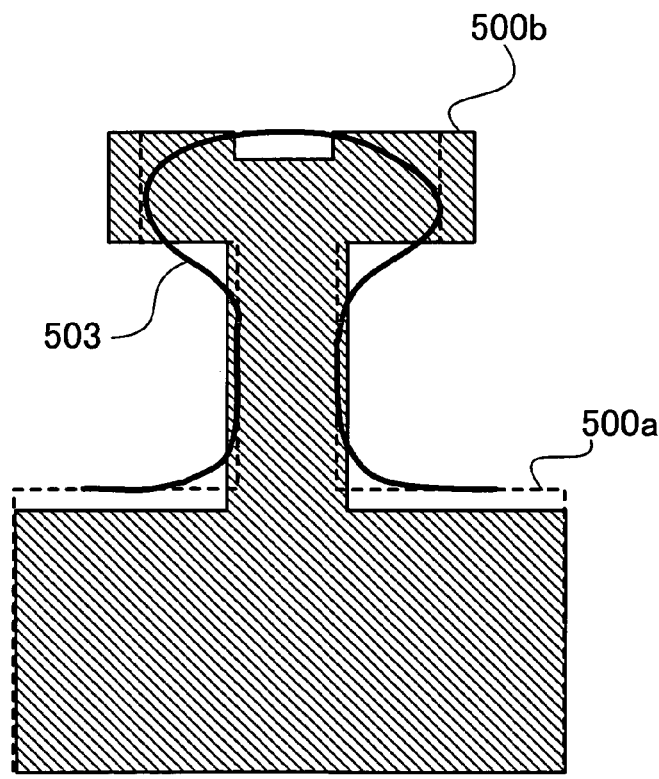

Then, the sides of the circuit pattern 10, contacting the FIG. 15 are moved inside by X5 and outside by X6 to generate FIG. 16 (see FIG. 8A), where X5 is (for example, 30 nm) about double the maximum correction amount X1 in the rule-based OPC, and X6 is (for example, 171 nm) the difference between X3 and X5. The FIG. 16 indicate areas where steps which cause broken lines due to excessive corrections to be made by model-based OPC are detected among the steps produced by the rule-based OPC.

Figure 9A:
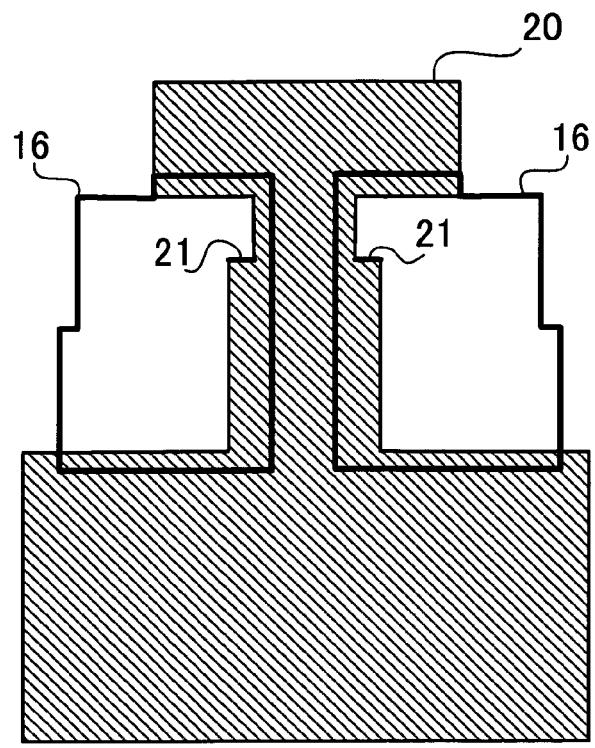
FIGS. 9A and 9B are views used for explaining the process for detecting and removing depressed steps close to circuit-pattern corners.

When a corrected circuit pattern 20 shown in FIG. 8B is obtained when the rule-based OPC is applied in step S14 shown in FIG. 3, for example, the generated FIG. 16 are put on top of the pattern 20. Among the sides of steps located in the FIG. 16, sides 21 are extracted, each of which has both ends forming an angle of 90 degrees and an angle of 270 degrees and has a length equal to or less than the maximum correction amount X1 of the rule-based OPC, as shown in FIG. 9A.

Figure 9B:
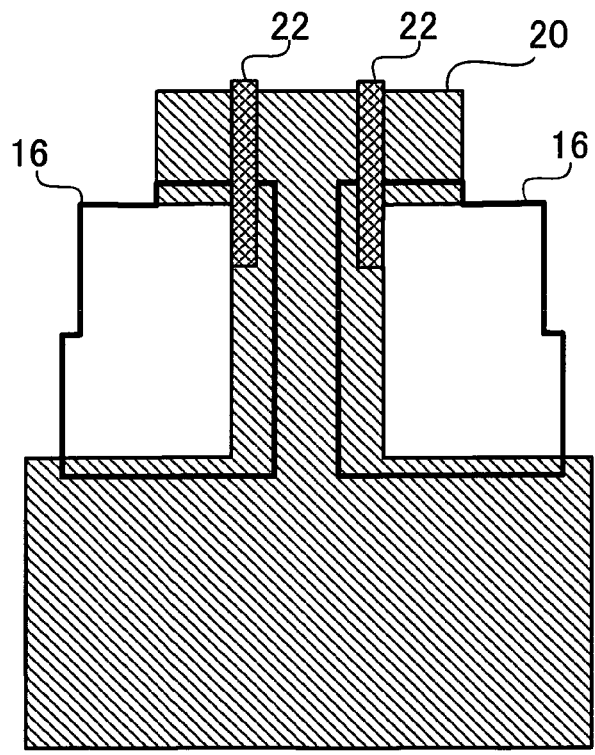

Next, the extracted sides 21 are moved toward the outside of the corrected circuit pattern 20 by a distance larger than an expected step size, for example, by 200 nm, and the loci are called FIG. 22, as shown in FIG. 9B. These figures surely fill in the steps.

Figure 10A:
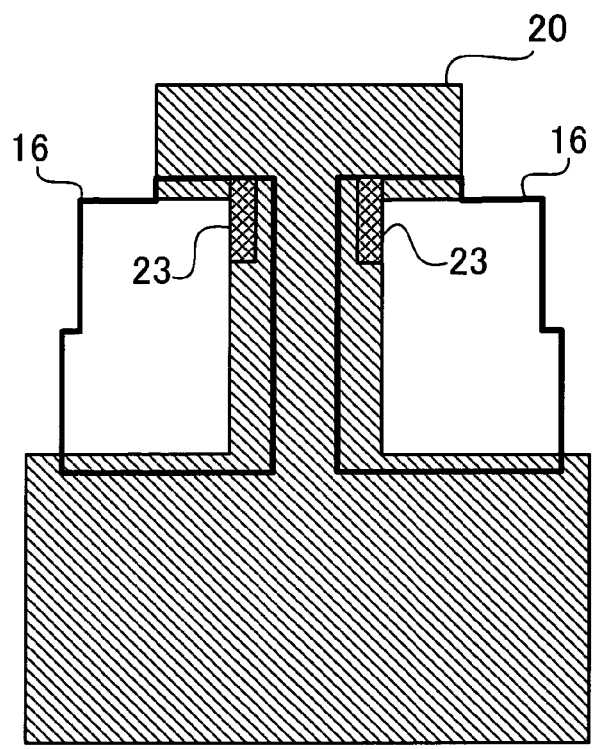
FIGS. 10A and 10B are views used for explaining the process for detecting and removing depressed steps close to circuit-pattern corners.

Only portions of the generated FIG. 22, overlapping with the FIG. 16 are extracted to generate FIG. 23 from which unnecessary portions are deleted, as shown in FIG. 10A.

Figure 10B:
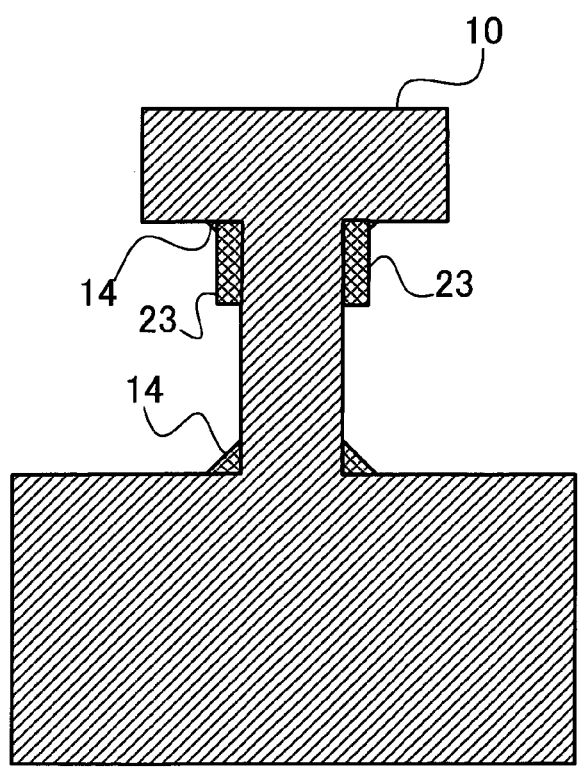
Figure 11A:
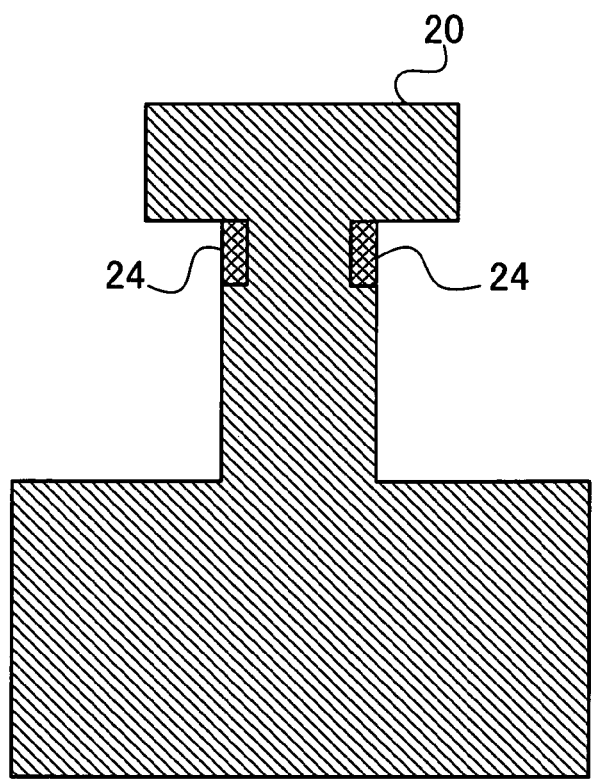
FIGS. 11A and 11B are views used for explaining the process for detecting and removing depressed steps close to circuit-pattern corners.
Figure 11B:
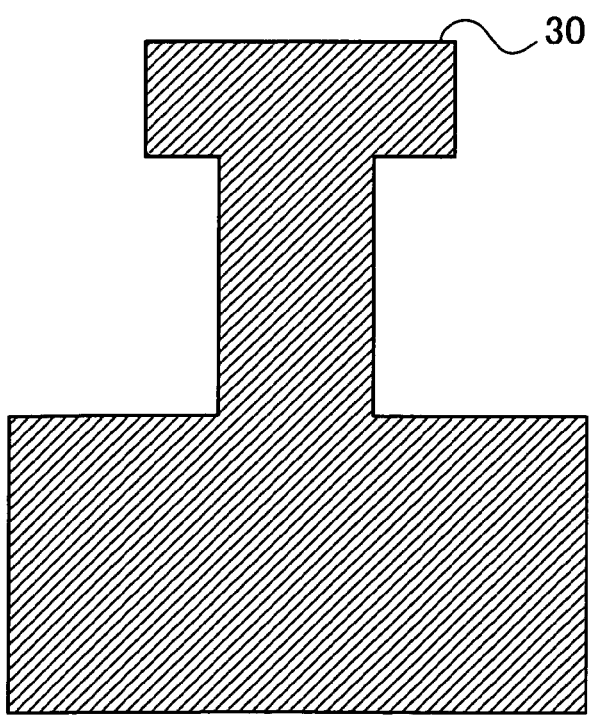

Next, the FIG. 14, generated to mark the circuit pattern corners, are read from the memory, and FIG. 23 which contact or overlap the FIG. 14 are extracted, as shown in FIG. 10B. Then, the corrected circuit pattern 20, obtained when the rule-based OPC is applied, is read again from the memory, and extracted FIG. 23 which do not overlap with the corrected circuit pattern 20 are extracted as FIG. 24, as shown in FIG. 11A. Lastly, the extracted FIG. 24 are integrated with the corrected circuit pattern 20 to obtain a corrected circuit pattern 30 having no step, as shown in FIG. 11B.

The process for detecting and removing a depressed step will be summarized below.

FIG. 12 is a flowchart of the process of detecting and removing a depressed step close to a circuit-pattern corner.

Step S30: Small-width areas which may cause broken lines are detected in the circuit pattern of the design data (see FIGS. 5A, 5B, and 6A).

Step S31: Corner areas where narrow portions may be generated in the model-based OPC are detected (see FIG. 6B).

Step S32: Circuit-pattern corners are marked (see FIG. 7A).

Step S33: Small-width areas which may cause broken lines due to narrowing in the model-based OPC are detected (see FIG. 7B).

Step S34: Detection areas where specific steps to be produced by the rule-based OPC are detected are generated (see FIG. 8A).

Step S35: Steps are detected in the detection areas from the corrected circuit pattern obtained when the rule-based OPC is applied (see FIG. 9A).

Step S36: The steps are filled in (see FIGS. 9B, 10A, 10B, 11A, and 11B).

With the foregoing process, depressed steps close to circuit-pattern corners are detected and removed.

A process of detecting and removing a protrudent step close to a circuit-pattern corner will be described next.

FIGS. 13A, 13B, 13C, 14A, 14B, 15A, and 15B are views used for explaining the process for detecting and removing a protrudent step close to a circuit-pattern corner.

Figure 13A:
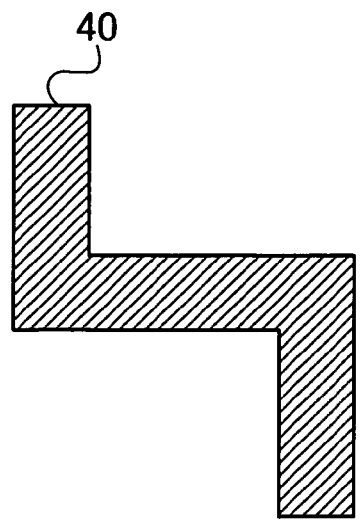
FIGS. 13A, 13B, and 13C are views used for explaining a process for detecting and removing protrudent steps close to circuit-pattern corners.
Figure 13B:
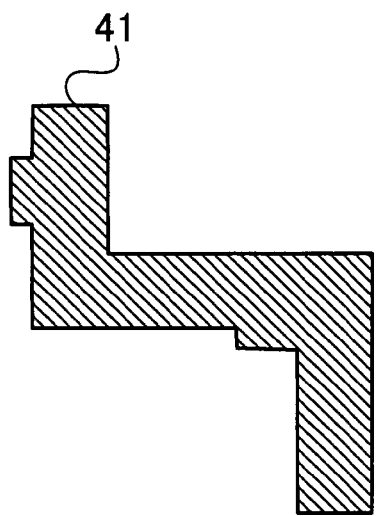
Figure 13C:
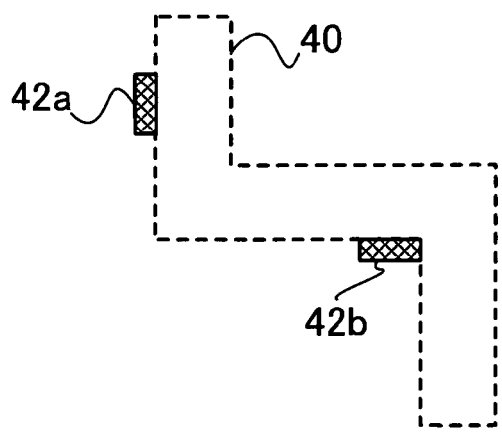

When a circuit pattern 40 shown in FIG. 13A in design data is input from a data base, for example, the CPU performs the following processing. First, a corrected circuit pattern 41 shown in FIG. 13B, obtained by the rule-based OPC in step S14 of FIG. 3 is read from the memory and differences between the circuit patterns 40 and 41 are obtained to generate FIGS. 42a and 42b, as shown in FIG. 13C.

Figure 14A:
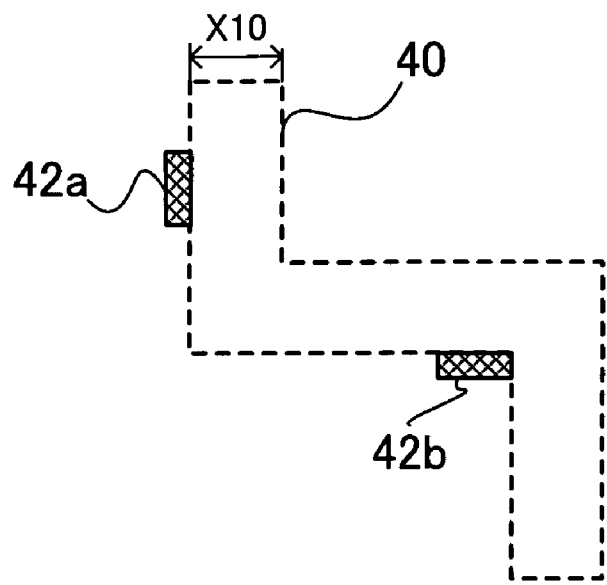
FIGS. 14A and 14B are views used for explaining the process for detecting and removing protrudent steps close to circuit-pattern corners.

Then, among the generated FIGS. 42a and 42b, any figures having a longer side longer than the maximum correction amount X1 of the rule-based OPC and shorter than X10, and having a shorter side shorter than X1 are extracted as shown in FIG. 14A, where X10 indicates the length of a portion which is regarded as a tip of the circuit pattern 40 when the model-based OPC is applied, and is set to any value by the operator. It is assumed in the current case that both FIGS. 42a and 42b satisfy the above condition. With this, minute steps produced by the rule-based OPC can be extracted.

Figure 14B:
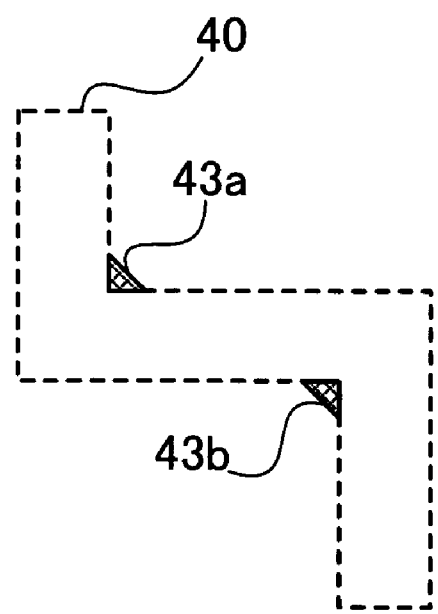

Next, FIGS. 43a and 43b are generated, as shown in FIG. 14B, at areas where the distances between points on two sides (longer than the minimum length X2 (for example, 34 nm) of a side to be corrected in the model-based OPC) orthogonal to each other in the circuit pattern 40 are shorter than X4 (smaller than X2 by some nanometers, and set, for example, to 30 nm). The FIGS. 43a and 43b obtained here are used to indicate circuit-pattern corners.

Then, among the FIGS. 42a and 42b, which indicate steps, any figures which contact or overlap with the FIG. 43a or 43b, which indicates a circuit-pattern corner, are extracted. With this, a step (FIG. 42b) close to a circuit-pattern corner, which may be applied excessive correction by the model-based OPC, can be extracted, as shown in FIG. 15A, among the minute steps produced by the rule-based OPC. The extracted FIG. 42b is removed from the corrected circuit pattern 41, obtained after the rule-based OPC, to obtain a corrected circuit pattern 45 having no step which may produce overcorrection in the model-based OPC, as shown in FIG. 15B.

The process for detecting and removing a protrudent step, described above, will be summarized.

FIG. 16 is a flowchart of the process for detecting and removing a protrudent step close to a circuit-pattern corner.

Step S40: Differences between the circuit pattern in the design data and the corrected circuit pattern obtained after the rule-based OPC are obtained (see FIG. 13C).

Step S41: Minute step-like figures are extracted (see FIG. 14A).

Step S42: Circuit-pattern corners are marked (see FIG. 14B).

Step S43: Any minute steps which contact or overlap with any of the circuit-pattern corners are extracted (see FIG. 15A).

Step S44: The extracted minute step is removed from the corrected circuit pattern obtained when the rule-based OPC is applied (see FIG. 15B).

With this process, a protrudent step close to a circuit-pattern corner can be detected and removed.

The process for detecting and removing a depressed or protrudent step close to a depressed circuit-pattern corner has been described above. A depressed or protrudent step close to a protrudent circuit-pattern corner can also be detected and removed by a similar technique.

With the use of the corrected circuit pattern having no step close to circuit-pattern corners, obtained by the process of step S15 of FIG. 3, described above in detail, the model-based OPC is performed in step S16. With this, evaluation points, which are locations to be corrected, can be prevented from being located close to circuit-pattern corners, and excessive correction is prevented at the circuit-pattern corners.

Exposure data obtained by such corrections is used to make a photomask, and exposure is performed to form a resist circuit pattern transferred to a wafer, preventing narrowing or disconnection and preventing metal wires from being broken. It is also possible to manufacture high-performance semiconductor devices having a high yield.

Further, steps close to circuit-pattern corners are removed, preventing shapes, such as thin-wire figures and slit-shaped figures, which make a reticle defect inspection difficult, from occurring.

According to the present invention, since a step close to a circuit-pattern corner, produced by proximity-effect correction by the rule-based OPC applied to design data is detected and removed, and then, exposure data in which the proximity effect is corrected by the model-based OPC is generated, evaluation points, which are locations to be corrected in the model-based OPC, are prevented from being located close to circuit-pattern corners, and excessive correction are prevented at the circuit-pattern corners.

Exposure data obtained by such corrections is used to make a photomask, and exposure is performed by using the photomask, preventing narrowing or disconnection in a reticle or a resist circuit pattern transferred to a wafer, and preventing metal wires from being broken.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A method for generating a photomask comprising:
    detecting, amongst semiconductor-device design data, small-width area data representing a small width area narrower than a threshold width value of a circuit pattern;
    determining a detection area including the small width area;
    applying a rule-based proximity-effect first correction to the semiconductor-device design data to produce first corrected data;
    detecting, amongst the first corrected data, step data representing a step region of the circuit pattern included in the detection area;
    modifying the first corrected data to flatten the step region of the circuit pattern to produce second corrected data;
    applying a model-based proximity-effect second correction to the second corrected data to produce third corrected data;
    generating exposure data based upon the third corrected data; and
    generating the photomask according to the exposure data, wherein: the detecting, amongst the semiconductor-device design data, detects the small-width area and corner area data representing a corner area that produces a narrow portion when the model-based proximity-effect correction is applied; and
    the determining determines the detection area data used for detecting the step data from the small-width area data and the corner area data.

2. The method according to claim 1, further comprising:
    detecting, amongst the semiconductor-device design data, corner area data representing a corner area of the circuit pattern that produces a narrow portion when the model-based proximity-effect correction is applied.

3. The method according to claim 1, wherein the modifying modifies the step data by replacing the step data with replacement data representing a figure to fit in the step region having a depression shape in the detection area represented by the detection area data.

4. The method according to claim 1, further comprising:
    obtaining replacement data representing a figure corresponding to a difference between the semiconductor-device design data and the first corrected data;
    the replacement data is detected as the step region according to the size of the figure represented by the replacement data and the distance between the figure and the circuit-pattern corner; and
    the figure is subtracted from the corrected circuit pattern to remove the step of a protruded shape.

5. The method according to claim 1, where the step region corresponds to a region formed on an edge of the circuit pattern.

6. A semiconductor-device manufacturing method comprising:
    detecting, amongst semiconductor-device design data, small-width area data representing a small width area narrower than a threshold width value of a circuit pattern;
    determining a detection area including the small width area;
    applying rule-based proximity-effect first correction to the semiconductor-device design data to produce first corrected data;
    detecting, amongst the first corrected data, step data representing a step region of the circuit pattern included in the detection area;
    modifying the first corrected data to flatten the step region of the circuit pattern to produce second corrected data;
    applying a model-based proximity-effect second correction to the second corrected data to produce third corrected data;
    generating exposure data based upon the third corrected data;
    generating a photomask according to the exposure data; and
    performing exposure by using the photomask, wherein: the detecting, amongst the semiconductor-device design data, detects the small-width area data and corner area data representing a corner area that produces a narrow portion when the model-based proximity-effect correction is applied; and
    the determining determines detection area data used for detecting the step data from the small-width area data and the corner area data.

7. The semiconductor-device manufacturing method according to claim 6, further comprising:
    detecting, amongst the semiconductor-device design data, corner area data representing a corner area of the circuit pattern that produces a narrow portion when the model-based proximity-effect correction is applied.

8. The semiconductor-device manufacturing method according to claim 6, wherein the modifying modifies the step data by replacing the step data with replacement data representing a figure that fits in the step region having a depression shape in the detection area represented by the detection area data.

9. The semiconductor-device manufacturing method according to claim 6,
    obtaining replacement data representing a figure corresponding to a difference between the semiconductor-device design data and the first corrected data;
    the replacement data is detected as the step region according to the size of the figure represented by the replacement data and the distance between the figure and the circuit-pattern corner; and
    the figure is subtracted from the corrected circuit pattern to remove the step of a protruded shape.

10. The semiconductor device manufacturing method according to claim 6, wherein the step region corresponds to a region formed in an edge of the circuit pattern.

* * * * *